United States Patent
Seppä et al.

(10) Patent No.: US 10,826,271 B2
(45) Date of Patent: Nov. 3, 2020

(54) LIMITED RANGE SOURCE OF ELECTROMAGNETIC RADIATION

(71) Applicant: TEKNOLOGIAN TUTKIMUSKESKUS VTT OY, Espoo (FI)

(72) Inventors: Santeri Jeremias Seppä, Espoo (FI); Thomas Fordell, Espoo (FI)

(73) Assignee: TEKNOLOGIAN TUTKIMUSKESKUS VTT OY, Espoo (FI)

( * ) Notice: Subject to any disclaimer, the term of this patent is extended or adjusted under 35 U.S.C. 154(b) by 0 days.

(21) Appl. No.: 16/871,125

(22) Filed: May 11, 2020

(65) Prior Publication Data

US 2020/0274325 A1    Aug. 27, 2020

Related U.S. Application Data

(63) Continuation of application No. PCT/FI2018/050832, filed on Nov. 13, 2018.

(51) Int. Cl.
| | | |
|---|---|---|
| *H01S 3/10* | (2006.01) | |
| *H01S 5/068* | (2006.01) | |
| *H01S 5/06* | (2006.01) | |
| *H01S 5/0683* | (2006.01) | |

(Continued)

(52) U.S. Cl.
CPC ........ *H01S 5/06804* (2013.01); *H01S 5/0601* (2013.01); *H01S 5/0607* (2013.01);

(Continued)

(58) Field of Classification Search
CPC .. H01S 5/06804; H01S 5/0617; H01S 5/0683; H01S 5/12; H01S 5/1092; H01S 5/0601; H01S 5/0607

See application file for complete search history.

(56) References Cited

U.S. PATENT DOCUMENTS

| | | | |
|---|---|---|---|
| 5,065,036 A | 11/1991 | Cropper et al. | |
| 5,307,358 A * | 4/1994 | Scheps | H01S 3/022 372/100 |

(Continued)

FOREIGN PATENT DOCUMENTS

| | | |
|---|---|---|
| CN | 1632994 A | 6/2005 |
| CN | 1285147 C | 11/2006 |
| JP | 2008288390 A | 11/2008 |

OTHER PUBLICATIONS

International Search Report issued by the European Patent Office acting as the International Searching Authority in relation to International Application No. PCT/FI2018/050832 dated Feb. 20, 2019 (4 pages).

(Continued)

*Primary Examiner* — Kinam Park

(74) *Attorney, Agent, or Firm* — Robert P. Michal, Esq.; Carter, DeLuca & Farrell LLP

(57) ABSTRACT

A limited range source of electromagnetic radiation and a radiation method, includes a tunable source of electromagnetic radiation; and a control element configured to tune the wavelength of the source of electromagnetic radiation to a desired wavelength corresponding to an absorption line of an atom or a molecule or other species present in the medium through which the electromagnetic radiation is to propagate; wherein the control element is configured to receive data relating to the desired wavelength.

16 Claims, 2 Drawing Sheets

(51) Int. Cl.
*H01S 5/10* (2006.01)
*H01S 5/12* (2006.01)
(52) U.S. Cl.
CPC .......... *H01S 5/0617* (2013.01); *H01S 5/0683* (2013.01); *H01S 5/1092* (2013.01); *H01S 5/12* (2013.01)

(56) References Cited

U.S. PATENT DOCUMENTS

| | | | |
|---|---|---|---|
| 6,420,695 | B1 | 7/2002 | Grasdepot et al. |
| 6,664,533 | B1 | 12/2003 | Van Der Laan et al. |
| 6,930,891 | B1* | 8/2005 | Hama .................. H05K 9/0039 361/800 |
| 8,982,352 | B1 | 3/2015 | Hoffnagle et al. |
| 2008/0151248 | A1 | 6/2008 | Cole et al. |
| 2008/0159341 | A1* | 7/2008 | Patel .................. G01N 21/1702 372/20 |
| 2009/0185175 | A1* | 7/2009 | Cole ......................... G01J 3/42 356/213 |
| 2012/0239013 | A1* | 9/2012 | Islam .................... H01S 5/0064 606/3 |
| 2016/0205758 | A1 | 7/2016 | Bezel et al. |
| 2017/0016813 | A1* | 1/2017 | Wagner .................. G01N 21/53 |

OTHER PUBLICATIONS

Written Opinion of the International Searching Authority issued by the European Patent Office acting as the International Searching Authority in relation to International Application No. PCT/FI2018/050832 dated Feb. 20, 2019 (5 pages).

Finnish Search Report issued by the Finnish Patent and Registration Office in relation to Finnish Application No. 20176019 dated Feb. 23, 2018 (1 page).

Second Finnish Search Report issued by the Finnish Patent and Registration Office in relation to Finnish Application No. 20176019 dated Jan. 11, 2019 (2 page).

Office Action issued by the Finnish Patent and Registration Office in relation to Finnish Application No. 20176019 dated Feb. 23, 2018 (7 pages).

Office Action issued by the Finnish Patent and Registration Office in relation to Finnish Application No. 20176019 dated Aug. 20, 2018 (7 pages).

Office Action issued by the Finnish Patent and Registration Office in relation to Finnish Application No. 20176019 dated Jan. 11, 2019 (8 pages).

Decision—Application Accepted issued by the Finnish Patent and Registration Office in relation to Finnish Application No. 20176019 dated Apr. 30, 2020 (1 page).

Finnish Letters Patent No. FI 128396 B dated Apr. 30, 2020 (20 pages).

Hieta et al "High-precision diode-laser-based temperature measurement for air refractive index compensation" Applied Optics, 50(31), 5990-5998. https://doi.org/10.1364/AO.50.005990.

Communication of Acceptance issued by the Finnish Patent and Registration Office in relation to Finnish Application No. 20176019 dated Feb. 27, 2020 (2 pages).

* cited by examiner

LIMITED RANGE SOURCE OF ELECTROMAGNETIC RADIATION

CROSS-REFERENCE TO RELATED APPLICATIONS

This application is a continuation of PCT International Application No. PCT/FI2018/050832 filed Nov. 13, 2018, which claims priority to Finnish Patent Application No. 20176019, filed Nov. 15, 2017, the disclosure of each of these applications is expressly incorporated herein by reference in their entirety.

TECHNICAL FIELD

The present application generally relates to a source of electromagnetic radiation. In particular, but not exclusively, the present application relates to a source of electromagnetic radiation with limited range. In particular, but not exclusively, the present application relates to a source of electromagnetic radiation with limited range using absorption.

BACKGROUND

This section illustrates useful background information without admission of any technique described herein being representative of the state of the art.

Lighting is constantly required and present in almost any aspect of modern life. Accordingly, an increasing amount of "light pollution" is also present in urban environments. There has been discussion aiming at reducing such unnecessary light, for example by limited light usage or spectrum.

Light, also visible light, is often required in situations in which visibility or communication is required, but it would be desirable that the light used is not visible to others. Such situations include for example nature observation, military operations, or limited-range telecommunication and telecommunication channel reuse.

Accordingly, there is need for sources of electromagnetic radiation with a limited range. It is the aim of the invention to provide such a source of electromagnetic radiation mitigating the problems related to undesired visibility or reach of light.

SUMMARY

Various aspects of examples of the invention are set out in the claims.

According to a first example aspect of the present invention, there is provided a limited range source of electromagnetic radiation, comprising
  a tunable source of electromagnetic radiation; and
  a control element configured to tune the wavelength of the source of electromagnetic radiation to a desired wavelength corresponding to an absorption line of an atom or a molecule or other species present in the medium through which the electromagnetic radiation is to propagate; wherein the control element is configured to receive data relating to the desired wavelength.

The limited range source of electromagnetic radiation may further comprise an arrangement for determining the desired wavelength configured to send data relating to the desired wavelength to the control element.

The arrangement for determining the desired wavelength may comprise a measuring element.

The arrangement for determining the desired wavelength may comprise imaging means.

The arrangement for determining the desired wavelength may comprise an absorption measurement means.

The source of electromagnetic radiation may comprise a source of visible or infrared light or microwave or terahertz radiation.

The data relating to the desired wavelength may comprise an assumption of the wavelength of the absorption line, information on ambient conditions and/or a determined wavelength of the absorption line.

The atom or the molecule present in the medium may be selected from the group of $O_2$, $O_3$, CO, $CO_2$, $H_2O$, $N_2O$, $CH_4$ and $N_2$.

According to a second example aspect of the present invention, there is provided a radiation method with limited range, comprising
  selecting a wavelength based on an assumption of the wavelength of an absorption line of an atom or a molecule present in the medium through which the electromagnetic radiation is to propagate;
  turning on a tunable source of electromagnetic radiation;
  tuning the source of electromagnetic radiation with a control element configured to tune the wavelength of the source of electromagnetic radiation to a desired wavelength corresponding to the absorption line of an atom or a molecule present in the medium through which the electromagnetic radiation propagates; wherein
  the control element is configured to receive data relating to the desired wavelength.

The method may further comprise determining and sending data relating to the desired wavelength to the control element with an arrangement for determining the desired wavelength.

Determining data relating to the desired wavelength may comprise measuring ambient conditions or wavelength with a measuring element.

Determining data relating to the desired wavelength may comprise imaging with imaging means.

Determining data relating to the desired wavelength may comprise measuring absorption with absorption measuring means.

The electromagnetic radiation may comprise visible or infrared light or microwave or terahertz radiation.

The data relating to the desired wavelength may comprise an assumption of the wavelength of the absorption line, information on ambient conditions and/or a determined wavelength of the absorption line.

The atom or the molecule present in the medium may be selected from the group of $O_2$, $O_3$, CO, $CO_2$, $H_2O$, $N_2O$, $CH_4$ and $N_2$.

According to a third example aspect of the present invention, there is provided an apparatus, comprising
  the limited range source of electromagnetic radiation of the first example aspect of the invention; and
  a processor configured to cause the apparatus to carry out the method of the second example aspect of the invention.

According to a fourth example aspect of the present invention, there is provided a computer program comprising computer code for causing performing the method of the second example aspect of the present invention, when executed by an apparatus.

According to a fifth example aspect of the present invention, there is provided a non-transitory memory medium comprising the computer program of the fourth example aspect of the present invention.

Different non-binding example aspects and embodiments of the present invention have been illustrated in the foregoing. The embodiments in the foregoing are used merely to explain selected aspects or steps that may be utilized in implementations of the present invention. Some embodiments may be presented only with reference to certain example aspects of the invention. It should be appreciated that corresponding embodiments may apply to other example aspects as well.

BRIEF DESCRIPTION OF THE DRAWINGS

For a more complete understanding of example embodiments of the present invention, reference is now made to the following descriptions taken in connection with the accompanying drawings in which.

DETAILED DESCRIPTION OF THE DRAWINGS

The present invention and its potential advantages are understood by referring to FIGS. 1 through 4 of the drawings. In this document, like reference signs denote like parts or steps.

Figure 1:
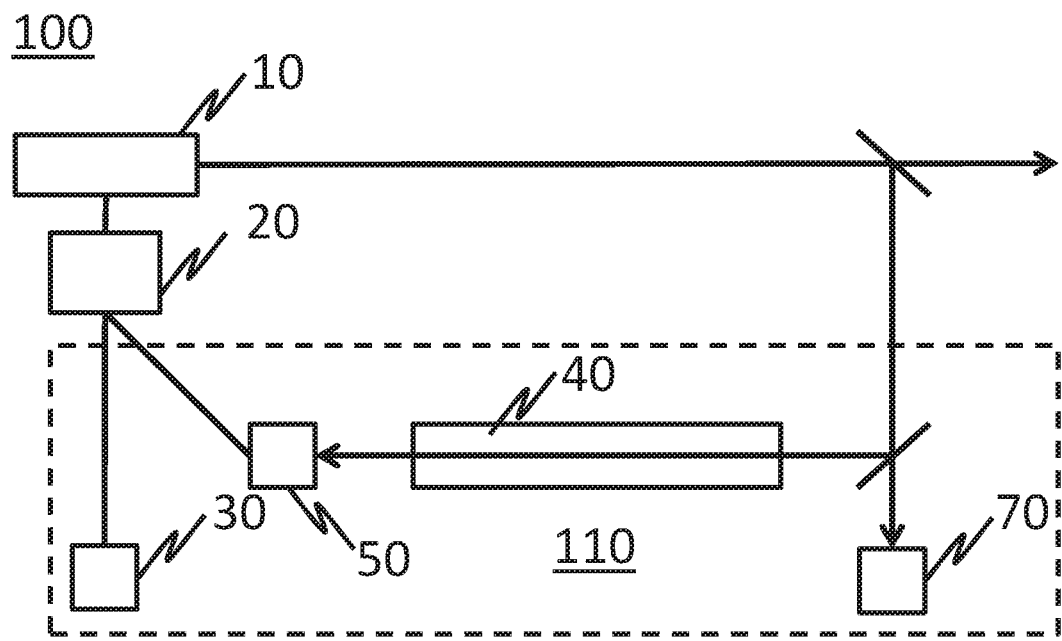
FIG. 1 shows a schematic block of a limited range source of electromagnetic radiation according to an embodiment of the invention.

FIG. 1 shows a schematic block of a limited range source of electromagnetic radiation according to an embodiment of the invention. It is to be noted that the term range refers to the distance the electromagnetic radiation travels prior to the intensity thereof being significantly reduced, i.e. the distance the electromagnetic radiation can reach. The limited range source of electromagnetic radiation 100 comprises a tunable source of electromagnetic radiation 10. The output wavelength of the source 10 is tunable to a desired wavelength and the source 10 has a small linewidth. In an embodiment, the electromagnetic radiation comprises visible or infrared light. In a further embodiment, the electromagnetic radiation comprises microwave or terahertz radiation. In an embodiment, the source 10 comprises a tunable laser source, such as a tunable distributed feedback, DFB, laser source. In a further embodiment, the source 10 comprises a broadband source of electromagnetic radiation with a tunable filter element for tuning the output wavelength. The limited range source of electromagnetic radiation 100 further comprises a power source (not shown), such as a battery or connection to an external power source, for powering the components thereof.

In operation, the output wavelength of the tunable source 10 is selected in such a way as to correspond to an absorption line of an atom or molecule present in the medium in which the electromagnetic radiation propagates. In an embodiment, the medium is air. In an embodiment, the atom or molecule is selected from the group of $O_2$, $O_3$, CO, $CO_2$, $H_2O$, $N_2O$, $CH_4$ and $N_2$.

The limited range source of electromagnetic radiation 100 further comprises a control element 20 configured to control the tuning of the source 10. In an embodiment, the control element 20 comprises conventional electronics configured to control the source 10. The control element is configured to receive data relating to the desired wavelength. In an embodiment, the data relating to the desired wavelength comprises an assumption of the wavelength of the absorption line desired. In an embodiment, the data relating to the desired wavelength comprises for example information on ambient conditions such as temperature and pressure. In an embodiment, the control element 20 comprises a user interface with which data relating to the desired wavelength can be input into the control element 20.

The limited range source of electromagnetic radiation 100, in an embodiment comprises an arrangement for determining the desired wavelength 110, i.e. for determining the wavelength of the absorption line of an atom or a molecule, or other species. In an embodiment, the arrangement for determining the desired wavelength is used to determine the desired wavelength, i.e. the said absorption line, if the desired wavelength is not known or is not accurately calculable by the control electronics based on available information. In a further embodiment, the arrangement for measuring the desired wavelength is not a physical part of the limited range source of electromagnetic radiation, but integrated with another device and connected to the limited range source of electromagnetic radiation 100 with wires or wirelessly. The arrangement for determining the desired wavelength 110 is configured to be connected to the control element in order to send data relating to the wavelength to the control element and to allow the control element to tune the source 10 to the determined wavelength.

In an embodiment, the arrangement for determining the desired wavelength 110 comprises a measuring element 30. In an embodiment, the measurement element comprises sensors for measuring ambient conditions. In a further embodiment, arrangement for determining the desired wavelength 110 comprises, in addition or instead, imaging means configured to detect light output from the source 10 and for example reflected, scattered or otherwise coming back at the imaging means. In an embodiment, the imaging means comprise a camera with a Charge-Coupled Device, CCD, sensor, or a further type of imaging detector, or a further sensor in the camera or separately outside the camera, and electronics configured to determine from the image the detected light and the desired wavelength, i.e. the absorption line of an atom or molecule, based on distances and intensity of electromagnetic radiation, for example radiation reflected to the sensor from a target at a certain distance. In an embodiment, if the distance is not known, the electronics are configured to detect the intensity variation of scattered light as wavelength is modulated and thus to infer the position of the absorption line relative to the emitted wavelength. In a still further embodiment, the measuring element 30 comprises, in addition or instead, means for measuring the output wavelength of the source 10 in order to ascertain that the source 10 is tuned to a desired wavelength.

In a further embodiment, arrangement for determining the desired wavelength 110 comprises, in addition or instead, an absorption measurement means whereto a part of the output of the source 10 is guided. The absorption measurement means, in an embodiment, comprises an absorption measurement path 40 comprising for example a multi-pass cell open to the ambient medium in which the electromagnetic radiation propagates. The absorption measurement means further comprises a photodetector element 50 for measuring the intensity of electromagnetic radiation exiting the absorption measurement path 40 in order to determine the desired wavelength, i.e. the absorption line of an atom or molecule based on the dip of intensity detected by the photodetector element 50 at that wavelength. In an embodiment, the absorption measurement means further comprises a reference photodetector 70 whereto a part of the output of the source 10 is guided without traversing the absorption measurement path 40.

Figure 2:
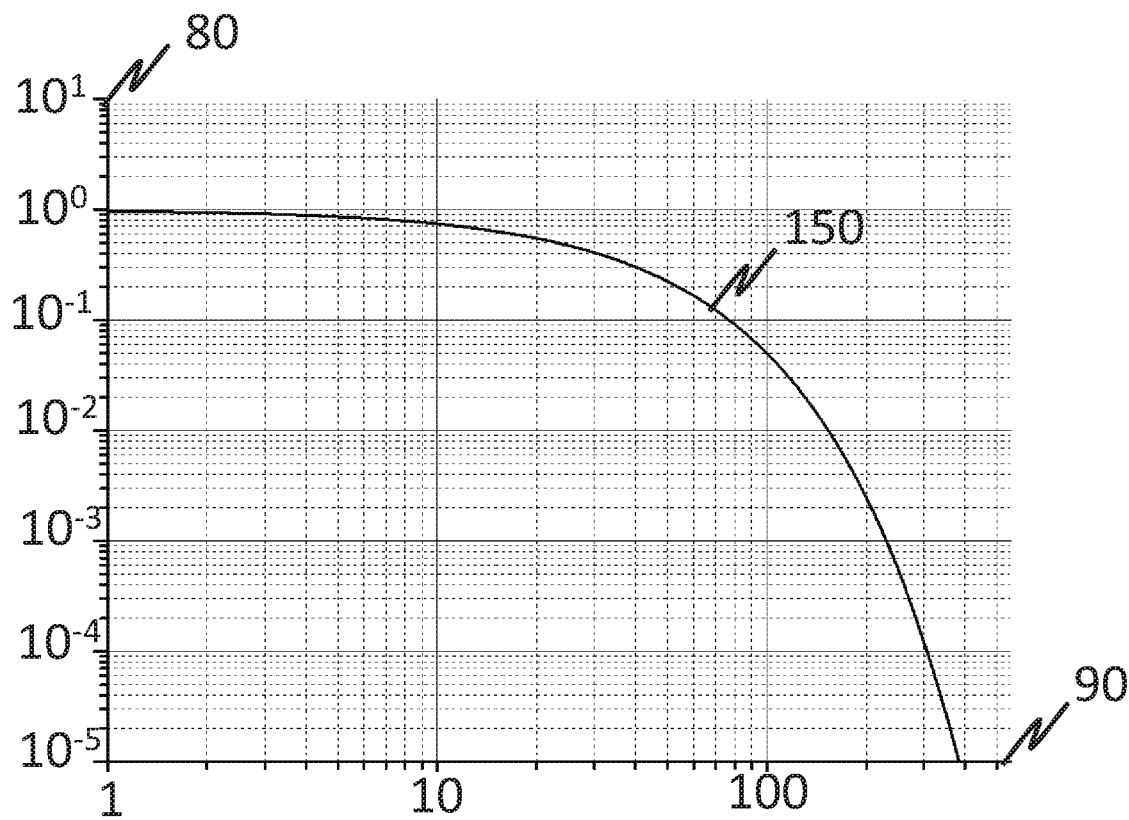
FIG. 2 shows an exemplary graph of transmission of a limited range source of electromagnetic radiation according to an embodiment of the invention.

FIG. 2 shows an exemplary graph of transmission of a limited range source of electromagnetic radiation in atmospheric air according to an embodiment of the invention. The transmission shown with line 150 is for wavelength of 760 nm corresponding to an absorption line of $O_2$. The vertical axis of FIG. 2 shows the transmission, i.e. the power transmitted to a given distance, with a logarithmic scale and the horizontal axis shows the distance in meters propagated from the source with a logarithmic scale. As can be seen from the graph of FIG. 2, at 100 m distance, only 5% of the light is left and accordingly, the range of the source of electromagnetic radiation is limited. The 760 nm wavelength is not visible to the naked eye, but can be viewed through suitable night vision equipment or through an imaging device sensitive to that wavelength, for example a CCD or CMOS imaging means without infrared filtering. A further example of the transmission of the limited range source of electromagnetic radiation 100 would be at the wavelength of 687 nm corresponding to an absorption line of $O_2$ and visible to the naked eye with which 10% of the light would be left at 1 km distance and 0, 1% at 3 km distance. Furthermore, it is to be noted that in particular with uncollimated radiation, the effect of normal intensity drop proportional to the square of the distance further reduces the intensity.

Figure 3:
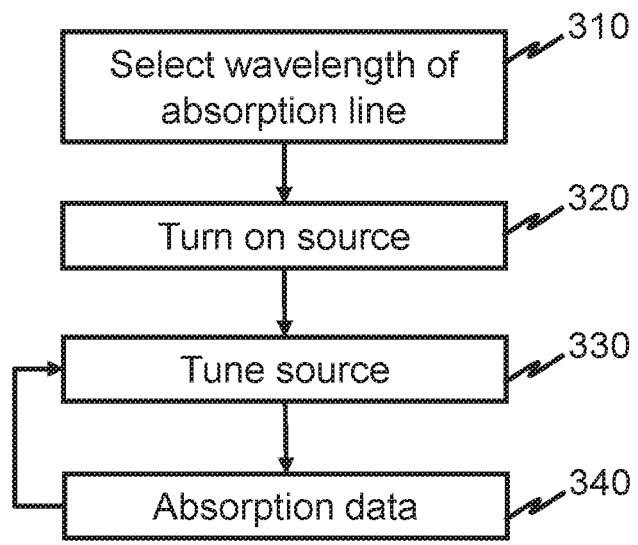
FIG. 3 shows a flow chart of a limited range radiation method according to an embodiment of the invention.

FIG. 3 shows a flow chart of a limited range radiation method according to an embodiment of the invention. At 310 a desired wavelength is selected. The desired wavelength corresponds to an absorption line of an atom or a molecule present in the medium, for example atmospheric air, in which the limited range source of electromagnetic radiation 100 is to be used. The desired wavelength is selected based on known absorption lines in known conditions and accordingly presents an informed assumption of the actual wavelength of the absorption line. At 310, if data relating to the desired wavelength is available, for example from measurement of ambient conditions, the control element 20 is configured to adjust the selected wavelength and/or the wavelength based on the data relating to the wavelength is directly selected.

At 320 the source of electromagnetic radiation 10 is turned on and the limited range source of electromagnetic radiation 100 is in use. At this point, the limitation of the range of light depends on the accuracy of correspondence of the selected wavelength with the desired absorption line. Accordingly, at 330 the control element 20 is configured to tune the wavelength of the source of electromagnetic radiation 10 in order to arrive at the desired wavelength corresponding to an absorption line of an atom or a molecule. In an embodiment, the control element 20 is configured to make sweep of a wavelength range around the selected wavelength in order to arrive at the desired wavelength. At step 340, which is carried out concurrently and continuously with step 330, the arrangement for determining the desired wavelength is configured to measure or estimate the absorption and the control element 20 is configured to determine the desired wavelength to which the source of electromagnetic radiation 10 is to be tuned from the data received from the measurement or estimate of the absorption.

In an embodiment, the absorption data is measured or estimated from at least one image obtained with imaging means comprised in the measuring element 30. The absorption data, in an embodiment, comprises information on the wavelength at which the absorption is at largest, i.e. the intensity of light detected is at its lowest. In an embodiment, the absorption data is measured or estimated using an absorption measurement path 40. The absorption data, in an embodiment, comprises information on the wavelength at which the absorption is at largest, i.e. the intensity of light detected by the photodetector element 50 is at its lowest.

Figure 4:
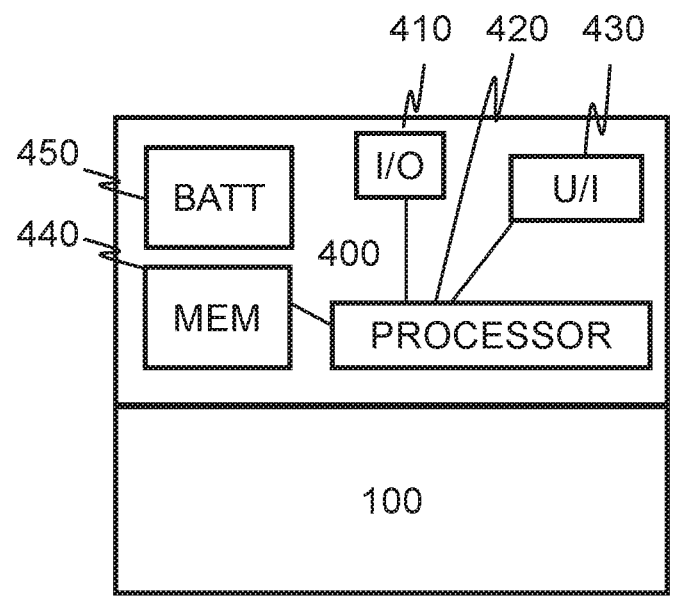
FIG. 4 shows a schematic block view of an apparatus according to an embodiment of the invention.

FIG. 4 shows a schematic block view of an apparatus according to an embodiment of the invention. The apparatus comprises at least one limited range source of electromagnetic radiation 100 according to an embodiment of the invention as hereinbefore described. In an embodiment, the apparatus 400 comprises more than one limited range source of electromagnetic radiation 100 according to an embodiment of the invention. In such a case, each limited range source of electromagnetic radiation 100 is configured to be tuned to a desired wavelength, same or different from the desired wavelength of further limited range sources of electromagnetic radiation 100.

The apparatus 400 further comprises electronics configured to control the operations of the apparatus, to carry out calculations and to cause carrying out the steps of the method according to the invention. The apparatus 400, in an embodiment, comprises a memory 440 and a processor 420. The processor 420 is, in an embodiment, configured to retrieve data from the measuring element 30 or the photodetector element 50 and to cause storing the data into the memory 440. The processor 420 is further configured to cause controlling of the operation of the apparatus and the limited range source of electromagnetic radiation 100 using a non-transitory computer program code stored in the memory 440. In an embodiment, the processor 420 is configured to carry out at least in part the functions of the control element 20 of the limited range source of electromagnetic radiation 100, i.e. the processor 420 replaces the control element 20.

In a further embodiment, the apparatus 400 comprises a communication unit 410 comprising, for example, a local area network (LAN) port; a wireless local area network (WLAN) unit; Bluetooth unit; cellular data communication unit; near field communication unit or satellite data communication unit. The apparatus 400 further comprises a power source, such as a battery 450 or a connection to external power.

In a further embodiment the apparatus 400 comprises a user interface unit 430 comprising for example a display or a touch display for showing the measurement result. In a further embodiment the user interface unit 430 comprises a simplified display, such as led array or lights of different colors, for example light emitting diodes, for indicating the result of the measurement.

In a still further embodiment, the apparatus 400 comprises, or is comprised in, a personal electronic device such as a flashlight, a wristwatch, a smart watch, an activity bracelet, a mobile phone, a smartphone, a tablet or a computer and configured to co-operate with the limited range source of electromagnetic radiation 100. In an embodiment, the apparatus 400 is comprised in a larger apparatus, such as a vehicle, a drone, a lighting installation or an electronic advertising board.

Some use cases relating to given embodiments of the limited range source of electromagnetic radiation according to embodiments of the invention, are presented in the following. In a first use case, the limited range source of electromagnetic radiation 100 is used to provide illumination in a situation in which the light should not be visible to others, for example in military operation or in nature observations.

In a second use case, the limited range source of electromagnetic radiation 100 is used to provide illumination less disturbing to others, for example as an additional light for vehicle arrangements such as collision warning arrangement.

In a third use case, the limited range source of electromagnetic radiation 100 is used for lighting while avoiding light pollution, for example in street lighting.

In a fourth use case, the limited range source of electromagnetic radiation 100 is used to create visual effects, for example an advertisement that looks different when viewed from different distances using several limited range source of electromagnetic radiations with different wavelengths having different transmission properties.

In a fifth use case, the limited range source of electromagnetic radiation 100 is used to create visual information visible only up to a certain distance, for example guide texts or light signals.

In a sixth use case, the limited range source of electromagnetic radiation 100 is used in limited range telecommunication, for example by modulating the intensity with a modulator.

Without in any way limiting the scope, interpretation, or application of the claims appearing below, a technical effect of one or more of the example embodiments disclosed herein is the provision of lighting that does not reach unwanted parties or distances. Another technical effect of one or more of the example embodiments disclosed herein is the reduction of light pollution. Another technical effect of one or more of the example embodiments disclosed herein is the provision of controlling the visibility and/or reach of electromagnetic radiation.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the foregoing describes example embodiments of the invention, these descriptions should not be viewed in a limiting sense. Rather, there are several variations and modifications which may be made without departing from the scope of the present invention as defined in the appended claims.

The invention claimed is:

1. A source of electromagnetic radiation configured to provide illumination, comprising:
   a tunable source of electromagnetic radiation comprising a tunable laser source with a small linewidth; and
   a control element configured to tune the wavelength of the source of electromagnetic radiation to a desired wavelength corresponding to an absorption line of an atom or a molecule or other species present in the medium through which the electromagnetic radiation is to propagate so that the range of the electromagnetic radiation in the medium is limited; wherein
   the control element is configured to receive data relating to the desired wavelength; and wherein the electromagnetic radiation comprises visible or infrared light,
   further comprising an arrangement for determining the desired wavelength configured to send data relating to the desired wavelength to the control element.

2. The source of electromagnetic radiation of claim 1, wherein the arrangement for determining the desired wavelength comprises a measuring element.

3. The source of electromagnetic radiation of claim 1, wherein the arrangement for determining the desired wavelength comprises imaging means.

4. The source of electromagnetic radiation of claim 1, wherein the arrangement for determining the desired wavelength comprises an absorption measurement means.

5. The source of electromagnetic radiation of claim 1, wherein the atom or the molecule present in the medium is selected from the group of $O_2, O_3, CO, CO_2, H_2O, N_2O, CH_4$ and $N_2$.

6. A method of providing illumination, comprising:
   selecting a wavelength based on an assumption of the wavelength of an absorption line of an atom or a molecule or other species present in the medium through which the electromagnetic radiation is to propagate;
   turning on a tunable source of electromagnetic radiation comprising a tunable laser source with a small linewidth;
   tuning the source of electromagnetic radiation to a desired wavelength corresponding to the absorption line of an atom or a molecule or other species present in the medium through which the electromagnetic radiation propagates so that the range of the electromagnetic radiation in the medium is limited;
   receiving data relating to the desired wavelength;
   wherein the electromagnetic radiation comprises visible or infrared light; and the method further comprises:
      determining and sending data relating to the desired wavelength with an arrangement for determining the desired wavelength.

7. The method of claim 6, wherein determining data relating to the desired wavelength comprises measuring ambient conditions or wavelength with a measuring element.

8. The method of claim 6, wherein determining data relating to the desired wavelength comprises imaging with imaging means.

9. The method of claim 6, wherein determining data relating to the desired wavelength comprises measuring absorption with absorption measuring means.

10. The method of claim 6, wherein the data relating to the desired wavelength comprises an assumption of the wavelength of the absorption line, information on ambient conditions and/or a determined wavelength of the absorption line.

11. The method of claim 6, wherein the atom or the molecule present in the medium is selected from the group of $O_2, O_3, CO, CO_2, H_2O, N_2O, CH_4$ and $N_2$.

12. An apparatus, comprising:
   a source of electromagnetic radiation configured to provide illumination, comprising:
   a tunable source of electromagnetic radiation comprising a tunable laser source with a small linewidth; and
   a control element configured to tune the wavelength of the source of electromagnetic radiation to a desired wavelength corresponding to an absorption line of an atom or a molecule or other species present in the medium through which the electromagnetic radiation is to propagate so that the range of the electromagnetic radiation in the medium is limited; wherein
   the control element is configured to receive data relating to the desired wavelength; and wherein the electromagnetic radiation comprises visible or infrared light; and a processor configured to cause the apparatus to:
select a wavelength based on an assumption of the wavelength of an absorption line of an atom or a molecule or other species present in the medium through which the electromagnetic radiation is to propagate;
turn on the tunable source of electromagnetic radiation; and
tune the source of electromagnetic radiation with the control element;
receive data relating to the desired wavelength; and
determine and send data relating to the desired wavelength to the control element.

13. The apparatus of claim 12, the apparatus comprising a handheld electronic device.

14. A non-transitory memory medium comprising computer program comprising computer code that, when executed by an apparatus, causes the apparatus to
select a wavelength based on an assumption of the wavelength of an absorption line of an atom or a molecule or other species present in the medium through which the electromagnetic radiation is to propagate;
turn on a tunable source of electromagnetic radiation comprising a tunable laser source with a small linewidth;
tune the source of electromagnetic radiation to a desired wavelength corresponding to the absorption line of an atom or a molecule or other species present in the medium through which the electromagnetic radiation propagates so that the range of the electromagnetic radiation in the medium is limited;
receive data relating to the desired wavelength; and
determine and send data relating to the desired wavelength with an arrangement for determining the desired wavelength,
wherein the electromagnetic radiation comprises visible or infrared light.

15. Use of the source of electromagnetic radiation of claim 1, for creating visual effects or visual information.

16. Use of the source of electromagnetic radiation of claim 1 in limited range telecommunication.

* * * * *